(12) United States Patent
Park et al.

(10) Patent No.: US 10,861,546 B2
(45) Date of Patent: Dec. 8, 2020

(54) SEMICONDUCTOR MEMORY DEVICE CAPABLE OF ADJUSTING A WORDLINE VOLTAGE FOR A WRITE OPERATION

(71) Applicants: SK hynix Inc., Icheon (KR); Seoul National University R&DB Foundation, Seoul (KR)

(72) Inventors: Hyunkyu Park, Seoul (KR); Suhwan Kim, Seoul (KR); Deog-Kyoon Jeong, Seoul (KR)

(73) Assignees: SK hynix Inc., Icheon (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 16/572,275

(22) Filed: Sep. 16, 2019

(65) Prior Publication Data
US 2020/0194067 A1 Jun. 18, 2020

(30) Foreign Application Priority Data

Dec. 17, 2018 (KR) .................. 10-2018-0162760
Aug. 13, 2019 (KR) .................. 10-2019-0098561

(51) Int. Cl.
*G11C 11/00* (2006.01)
*G11C 13/00* (2006.01)

(52) U.S. Cl.
CPC ...... *G11C 13/0069* (2013.01); *G11C 13/0004* (2013.01); *G11C 13/0026* (2013.01); *G11C 13/0028* (2013.01); *G11C 13/0038* (2013.01)

(58) Field of Classification Search
CPC ............ G11C 13/0004; G11C 13/0026; G11C 13/0028; G11C 13/0038; G11C 13/0069
See application file for complete search history.

(56) References Cited

U.S. PATENT DOCUMENTS

| 7,307,268 | B2* | 12/2007 | Scheuerlein | ....... G11C 13/0004 257/2 |
| 9,299,430 | B1* | 3/2016 | Bertin | ................ G11C 13/0004 |
| 2011/0019495 | A1* | 1/2011 | Scheuerlein | ............. G11C 8/08 365/230.06 |
| 2012/0044733 | A1* | 2/2012 | Scheuerlein | ....... G11C 13/0004 365/51 |

(Continued)

FOREIGN PATENT DOCUMENTS

| KR | 101116407 B1 | 3/2012 |
| KR | 20170014872 A | 2/2017 |

*Primary Examiner* — Toan K Le

(57) ABSTRACT

A semiconductor memory device includes a memory cell array including a plurality of wordlines, a plurality of bitlines and a plurality of cells; a bitline decoder configured to couple a global bitline to one of the plurality of bitlines according to a bitline selection signal; a bitline driver configured to provide bitline current to the global bitline; a wordline decoder configured to couple a global wordline to one of the plurality of wordlines according to a wordline selection signal; a wordline driver configured to provide a wordline drive voltage to the global wordline during a write operation and to adjust the wordline drive voltage according to a write address; and a write control circuit configured to generate the wordline selection signal and the bitline selection signal, and to control the bitline decoder, the wordline decoder, and the bitline driver.

20 Claims, 11 Drawing Sheets

(56) References Cited

U.S. PATENT DOCUMENTS

| | | | | |
|---|---|---|---|---|
| 2012/0155149 A1* | 6/2012 | Maejima | ............ | G11C 13/0069 |
| | | | | 365/148 |
| 2014/0098594 A1* | 4/2014 | Azuma | .............. | G11C 13/0007 |
| | | | | 365/148 |
| 2015/0348626 A1* | 12/2015 | Nakayama | ......... | G11C 13/0002 |
| | | | | 365/51 |
| 2017/0032838 A1* | 2/2017 | Park | ................... | G11C 13/0002 |

* cited by examiner

FIG. 8

| Cell Address | Control Code |
|---|---|
| ADDR1 | CODE1 |
| ADDR2 | CODE2 |
| ADDR3 | CODE3 |
| ADDR4 | CODE4 |
| ... | ... |

| Cell Region | Control Code |
|---|---|
| A1 | CODE1 |
| A2 | CODE2 |
| A3 | CODE3 |
| A4 | CODE4 |

500

<Present Disclosure>

SEMICONDUCTOR MEMORY DEVICE CAPABLE OF ADJUSTING A WORDLINE VOLTAGE FOR A WRITE OPERATION

CROSS-REFERENCE TO RELATED APPLICATION

The present application claims priority under 35 U.S.C. § 119(a) to Korean Patent Application No. 10-2018-0162760, filed on Dec. 17, 2018 and Korean Patent Application No. 10-2019-0098561, filed on Aug. 13, 2019, which are incorporated herein by reference in its entirety.

BACKGROUND

1. Technical Field

Various embodiments may relate to a semiconductor memory device capable of adjusting a wordline voltage during a write operation, and more particularly, to a semiconductor memory device capable of adjusting a wordline voltage according to an address of a cell during a write operation.

2. Related Art

A phase change memory (PCM) device, which uses a material having resistance characteristics that vary depending on its crystal structure, is being developed.

For example, the resistance value of a cell in a crystalline state is smaller than the resistance value of the cell in an amorphous state.

FIG. 1 illustrates a read operation of a phase change memory device.

In FIG. 1, the horizontal axis represents a voltage across a memory cell and the vertical axis represents a current (or a cell current) flowing through the memory cell that includes a phase change material.

A read voltage $V_{READ}$ that is higher than a set threshold voltage $V_{th,\ SET}$ and lower than a reset threshold voltage $V_{th,\ RST}$ is applied in the reading operation.

For example, the read voltage $V_{READ}$ is a voltage across the memory cell.

When the phase change material is in an amorphous state, the cell current increases along lines (2) and (4) as the cell voltage increases, and thus remains lower than a threshold current $I_{th}$ when the cell voltage reaches the read voltage $V_{READ}$.

If the phase change material is in a crystalline state, the cell current increases along lines (2) and (3) as the cell voltage increases, a snapback phenomenon (or snapback) occurs after reaching the threshold current $I_{th}$, and then the cell current increase rapidly along line (1).

The reciprocal of the slope of line (1) corresponds to the on resistance of the phase change material.

The cell is programmed to a set state or a reset state in a write operation.

In the write operation, a bitline driver supplies a current to a bitline coupled to the cell, and a wordline driver controls a voltage of the wordline coupled to the cell. After a snapback phenomenon occurs in the cell, a large amount of current is applied for a short time period to reset the cell to an amorphous state, or a small amount of current is applied for a long time period to set the cell to a crystalline state.

A distance between the bitline driver and a specific cell and a distance between the wordline driver and the specific cell vary depending on a position of the cell in a memory cell array. As a result, parasitic resistance and parasitic capacitance associated with the cell also vary according to its position.

Thus, in a conventional phase change memory device, a set threshold voltage and a reset threshold voltage of a cell may vary depending on its position.

When set threshold voltages, or reset threshold voltages, or both vary depending on positions of a plurality of cells, a margin of a read voltage to read data in the cells becomes narrow, thereby deteriorating the reliability of a read operation.

SUMMARY

In accordance with an embodiment of the present disclosure, a semiconductor memory device may include a memory cell array including a plurality of wordlines, a plurality of bitlines and a plurality of cells; a bitline decoder configured to couple a global bitline to one of the plurality of bitlines according to a bitline selection signal; a bitline driver configured to provide bitline current to the global bitline; a wordline decoder configured to couple a global wordline to one of the plurality of wordlines according to a wordline selection signal; a wordline driver configured to provide a wordline drive voltage to the global wordline during a write operation and to adjust the wordline drive voltage according to a write address; and a write control circuit configured to generate the wordline selection signal and the bitline selection signal, and to control the bitline decoder, the wordline decoder, and the bitline driver.

In accordance with an embodiment of the present disclosure, a memory device may include a first memory cell coupled to a first bitline and a first wordline; a second memory cell coupled to a second bitline and a second wordline; a wordline decoder configured to couple a global wordline to one of the first and second wordlines according to a wordline selection signal; a wordline driver configured to provide a wordline drive voltage to the global wordline during a write operation; and a code setting circuit configured to set a first control code corresponding to a first reference wordline drive voltage for the first memory cell, and to set a second control code corresponding to a second reference wordline drive voltage for the second memory cell.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments that include various features, and explain various principles and beneficial aspects of those embodiments.

FIG. 8 illustrates a data structure stored in a code setting circuit according to an embodiment of the present disclosure.

FIG. 10 illustrates a data structure stored in a code setting circuit according to an embodiment of the present disclosure.

DETAILED DESCRIPTION

Various embodiments will be described below with reference to the accompanying figures. Embodiments are provided for illustrative purposes and other embodiments that are not explicitly illustrated or described are possible. Further, modifications can be made to embodiments of the present disclosure that will be described below in detail.

Figure 2:
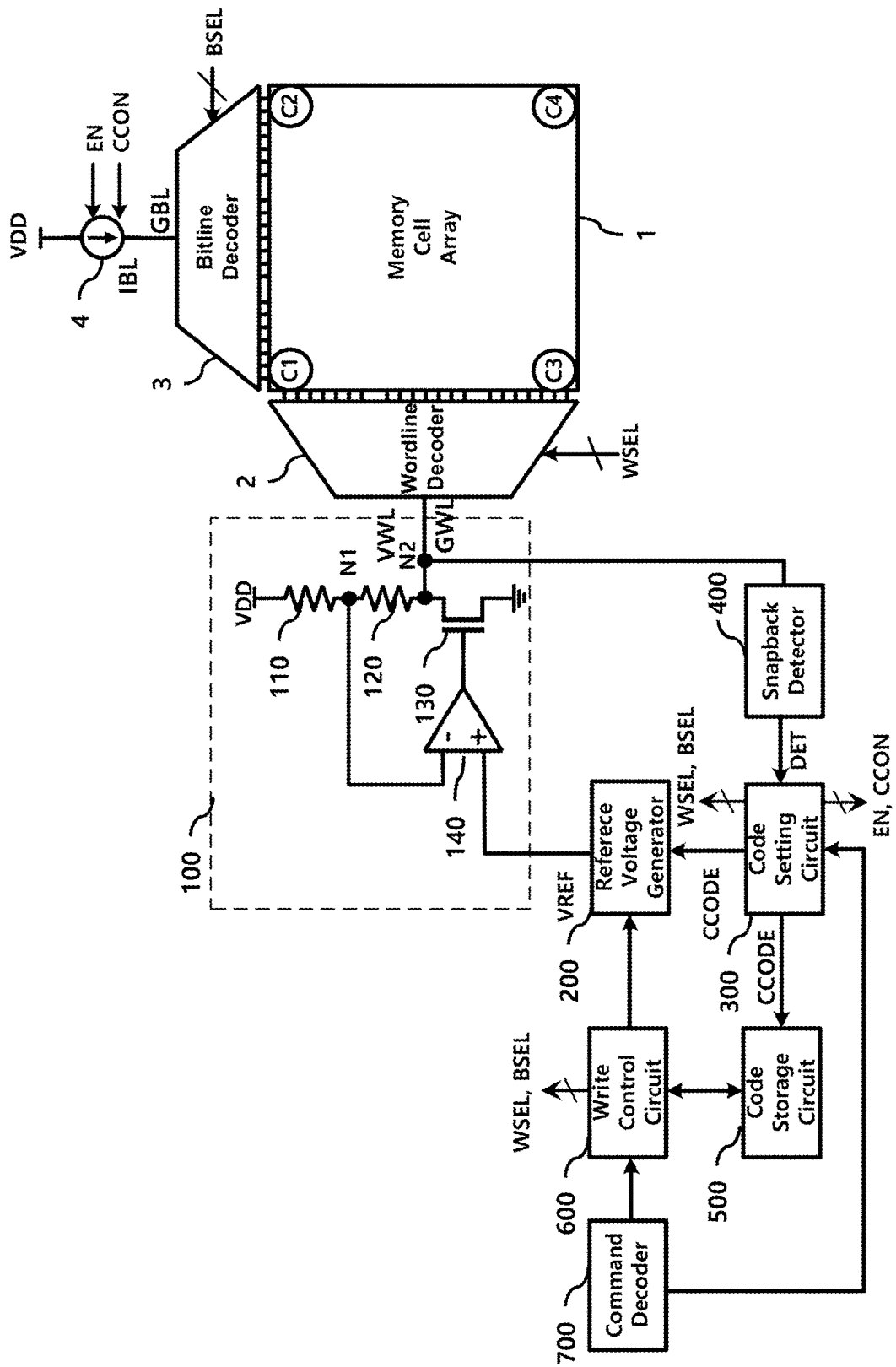
FIG. 2 illustrates a semiconductor memory device according to an embodiment of the present disclosure.

FIG. 2 illustrates a semiconductor memory device according to an embodiment of the present disclosure.

A semiconductor memory device according to an embodiment of the present disclosure includes a memory cell array 1, a wordline decoder 2, a bitline decoder 3, a bitline driver 4, and a wordline driver 100.

A semiconductor memory device according to an embodiment of the present disclosure further includes a reference voltage generator 200, a code setting circuit 300, a snapback detector 400, a code storage circuit 500, a write control circuit 600, and a command decoder 700.

The memory cell array 1 includes a plurality of memory cells. Hereinafter, each of the plurality of memory cells may be referred to as a cell.

FIG. 2 illustrates four cells C1, C2, C3, and C4 as an example.

A first cell C1 represents a cell where a first wordline and a first bitline intersect, and a second cell C2 represents a cell where the first wordline and a last bitline intersect.

A third cell C3 represents a cell where the last wordline and the first bitline intersect, and a fourth cell C4 represents a cell where the last wordline and the last bitline intersect.

The wordline decoder 2 provides a wordline drive voltage VWL to a selected wordline in accordance with a wordline selection signal WSEL.

The bitline decoder 3 provides a bitline drive current IBL to a selected bitline in accordance with a bitline selection signal BSEL.

In an embodiment, the wordline selection signal WSEL and the bitline selection signal BSEL may be provided by the write control circuit 600 during a write operation. However, embodiments of the present disclosure are not limited thereto. For example, the code setting circuit 300 may provide the wordline selection signal WSEL and the bitline selection signal BSEL during a code setting operation.

The bitline driver 4 provides the bitline drive current IBL to a global bitline GBL. For example, the bitline driver 4 determines a waveform of the bitline drive current IBL according to an activation signal EN and a current control signal CCON.

In an embodiment, the activation signal EN and the current control signal CCON may be provided by the write control circuit 600 during a write operation. However, embodiments of the present disclosure are not limited thereto. For example, the code setting circuit 300 may provide the activation signal EN and the current control signal CCON during a code setting operation.

The wordline driver 100 provides the wordline drive voltage VWL to the global wordline GWL.

In an embodiment, the wordline driver 100 generates the wordline drive voltage VWL based on a reference voltage VREF.

For example, the wordline driver 100 includes a first resistor 110 coupled between a power supply VDD and a first node N1, a second resistor 120 coupled between the first node N1 and a second node N2, a transistor (e.g., an NMOS transistor) 130 whose source and drain are coupled between the second node N2 and ground, and an operational amplifier 140.

The operational amplifier 140 amplifies the voltage difference between the reference voltage VREF and a voltage at the first node N1 and controls a gate voltage of the NMOS transistor 130, thereby controlling the wordline drive voltage VWL output at the second node N2 using a feedback operation. For example, a negative feedback loop including the operation amplifier 140 with a negative gain, the transistor 130, and the second resistor 120 operates to increase the wordline driver voltage VWL when the reference voltage VREF increases, and to decrease the wordline driver voltage VWL when the reference voltage VREF decreases. In another embodiment, when the operation amplifier 140 has a positive gain, the operation amplifier 140 has a non-inverting input that is connected to the first node N1 and an inverting input that receives the reference voltage VREF.

The reference voltage generator 200 generates the reference voltage VREF based on a control code CCODE.

Figure 3:
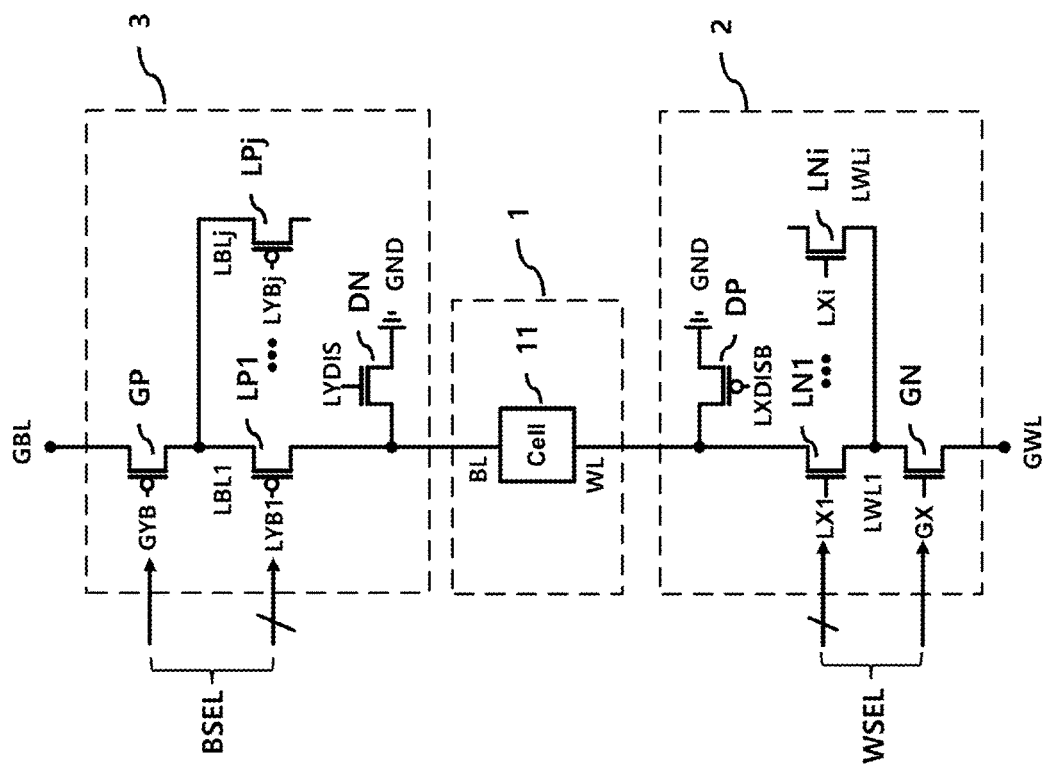
FIG. 3 illustrates a bitline decoder and a wordline decoder according to an embodiment of the present disclosure.

FIG. 3 illustrates a memory cell array 1, a wordline decoder 2, and a bitline decoder 3 according to an embodiment of the present disclosure. The memory cell array 1, the wordline decoder 2, and the bitline decoder 3 in FIG. 3 may be suitable for use as the memory cell array 1, the wordline decoder 2, and the bitline decoder 3 in FIG. 2, respectively.

The memory cell array 1 includes a plurality of memory cells 11 and each memory cell 11 is coupled between a bitline BL and a wordline WL. Only a single memory cell 11 selected among the plurality of memory cells 11 is shown in FIG. 3 for the interest of brevity.

The wordline decoder 2 includes a global wordline switch GN and a plurality of local wordline switches LN1 to LNi.

The wordline selection signal WSEL includes a global wordline switch control signal GX and a plurality of local wordline switch control signals LX1 to LXi.

The global wordline switch control signal GX controls the global wordline switch GN, and the plurality of local wordline switch control signals LX1 to LXi control the plurality of local wordline switches LN1 to LNi, respectively.

The global wordline switch GN couples the global wordline GWL with a plurality of local wordlines LWL1 to LWLi.

The wordline decoder 2 further includes a wordline discharge switch DP for discharging the charge of the wordline WL in response to a wordline discharge control signal LXDISB.

The bitline decoder 3 includes a global bitline switch GP and a plurality of local bitline switches LP1 to LPj.

The bitline selection signal BSEL includes a global bitline switch control signal GYB and a plurality of local bitline switch control signals LYB1 to LYBj.

The global bitline switch control signal GYB controls the global bitline switch GP, and the plurality of local bitline switch control signals LYB1 to LYBj control the plurality of local bitline switches LP1 to LPj, respectively.

The global bitline switch GP connects the global bitline GBL with a plurality of local bitlines LBL1 to LBLj.

The bitline decoder 3 further includes a bitline discharge switch DN for discharging the charge of the bitline BL in response to a bitline discharge control signal LYDIS.

Figure 4:
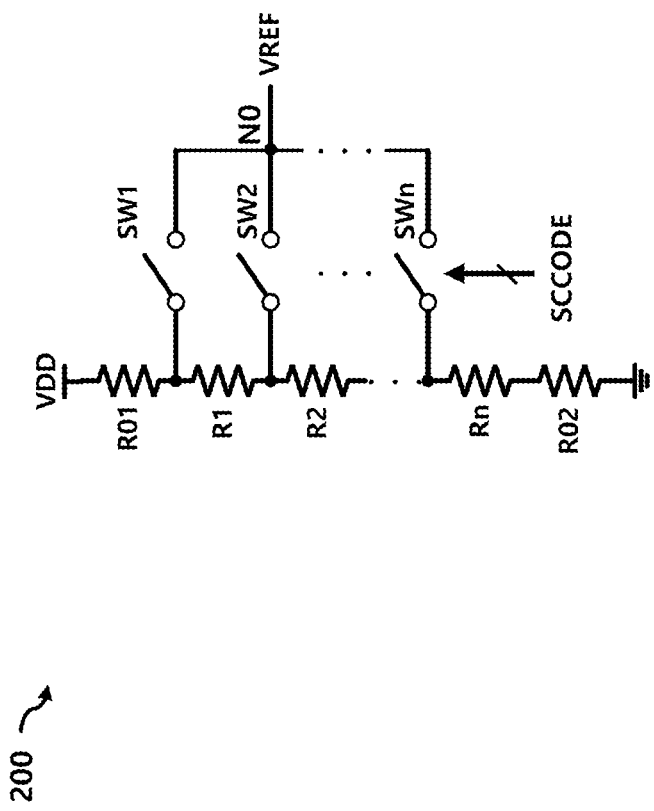
FIG. 4 illustrates a reference voltage generator according to an embodiment of the present disclosure.

FIG. 4 illustrates a reference voltage generator 200 according to an embodiment of the present disclosure. The reference voltage generator 200 in FIG. 4 may be suitable for use as the reference voltage generator 200 in FIG. 2.

In an embodiment, the reference voltage generator 200 includes a plurality of resistors R1, R1 to Rn, and R02, which are connected in series between a power supply VDD and ground. The reference voltage generator 200 further includes a plurality of switches SW1 to SWn, each of which is controlled by a corresponding bit of a switch control code SCCODE. In an embodiment, the switch control code SCCODE is obtained by performing a one-hot encoding operation on a control code (e.g., the control code CCODE in FIG. 2), and thus the switch control code SCCODE has a value with a single high bit and the remaining low bits. For example, the first switch SW1 is turned on while the remaining switches SW2 to SWn are turned off when the switch control code SCCODE has a n-bit value of [0 0 . . . 0 1], the second switch SW2 is turned on while the remaining switches SW1 and SW3 to SWn are turned off when the switch control code SCCODE has a n-bit value of [0 0 . . . 1 0], and so on.

A first node of each of the plurality of switches SW1 to SWn is commonly connected to an output node NO where the reference voltage VREF is output.

A second node of each of the plurality of switches SW1 to SWn is connected to a node between a corresponding pair of the plurality of resistors R01 and R1 to Rn.

For example, the second node of the first switch SW1 is coupled to a node between the first resistor R01 and the second resistor R1, and the second node of the second switch SW2 is coupled to a node between the second resistor R1 and the third resistor R2.

The plurality of switches SW1 to SWn are controlled according to the control code (e.g., the control code CCODE in FIG. 2), and accordingly, the reference voltage VREF is controlled to have a voltage which is obtained by dividing the supply voltage VDD with a corresponding resistance ratio. For example, the first switch SW1 is turned on to couple the node between the first resistor R01 and the second resistor R1 to the output node NO when has the switch control code SSCODE has a n-bit value of [0 . . . 0 1]. The second switch SW2 is turned on to couple the node between the second resistor R1 and the third resistor R2 to the output node NO when has the switch control code SSCODE has a n-bit value of [0 . . . 0 1 0]. As a result, a level of the reference voltage VREF decreases as the value of the switch control code SCCODE increases. In an embodiment, the value of the switch control code SCCODE is a result of performing a one-hot encoding operation on the control code (e.g., the control code CCODE in FIG. 2), and thus the level of the reference voltage VREF decreases as the value of the control code increases.

In an embodiment, a level of the wordline drive voltage VWL varies according to an address of a cell during a write operation.

As a result, the variance of set threshold voltages, or the variance of reset threshold voltages, or both may be reduced.

Referring back to FIG. 2, the code setting circuit 300 sets the value of the control code CCODE used to generate the reference voltage VREF according to the address of the cell.

Starting condition of a code setting operation by the code setting circuit 300 may vary according to the embodiment.

In an embodiment, the code setting circuit 300 may operate during an initialization process of a semiconductor memory device.

In another embodiment, the code setting circuit 300 may operate in response to an instruction by the command decoder 700. For example, a memory controller (not shown) may generate a command signal for initiating the code setting operation and provide the command signal to the semiconductor memory device.

The code setting circuit 300 performs the code setting operation to determine the value of the control code CCODE according to a position of a cell and stores the control code CCODE in the code storage circuit 500.

The code setting circuit 300 controls the bitline driver 4 by generating an activation signal EN and a current control signal CCON during the code setting operation.

An operation of the code setting circuit 300 will be described in detail below.

The snapback detector 400 detects whether a snapback phenomenon has occurred in a cell (e.g., the memory cell 11 in FIG. 3) during the code setting operation.

The snapback detector 400 may be implemented as a circuit generally used in the process of reading or writing a memory device, so that detailed descriptions will be omitted for the interest of brevity.

The code storage circuit 500 stores the control code CCODE set by the code setting circuit 300 according to the address of the cell.

The code storage circuit 500 may be implemented using a volatile memory device (e.g., a register, a DRAM), or a non-volatile memory device.

In an embodiment, the code setting circuit 300 performs a code setting operation during an initialization process of the semiconductor memory device.

After the code setting circuit 300 has completed an initial code setting operation, the code setting circuit 300 can further perform one or more code setting operations when the semiconductor memory device is used.

If the code storage circuit 500 is a non-volatile memory device, the initial code setting operation may be performed during a production stage of the semiconductor memory device, or during an initialization process when the semiconductor memory device is used for the first time.

In an embodiment, the code setting circuit 300 and the snapback detector 400 may not be included in the semiconductor memory device but may be provided in a separate device. In an embodiment, values of one or more control codes CCODE each can be predetermined and stored according to a corresponding cell address.

However, if the code storage circuit 500 is a volatile memory device, it may be preferable that the code setting circuit 300 and the snapback detector 400 are provided in the semiconductor memory device in order to perform a code setting operation when it is desirable.

The write control circuit 600 performs one or more control operations during a write operation for a cell.

For example, the write control circuit 600 generates one or more signals to control the wordline decoder 2, the bitline decoder 3, and the bitline driver 4 during the write operation.

The write control circuit 600 further refers to a write address and accesses the code storage circuit 500 to provide the reference voltage generator 200 with a control code CCODE corresponding to a selected cell based on the write address.

Accordingly, the write control circuit 600 can adjust the wordline drive voltage VWL according to the write address during the write operation, and as a result, the variation (e.g., variance) of set threshold voltages, or the variation of reset threshold voltages, or both, can be reduced.

The command decoder 700 receives a command signal and an address signal from a host like a memory controller.

For example, the command decoder 700 provides a write address to the write control circuit 600 in response to a write command and can control the write control circuit 600 to start a write operation.

The command decoder 700 can control the code setting circuit 300 to perform the code setting operation during an initialization process of the semiconductor memory device. For example, the code setting circuit 300 can be controlled using a signal (e.g., a power-on reset POR signal) indicating such an initialization process.

In an embodiment, the code setting circuit 300 can perform the code setting operation independently from the initialization process. For example, the code setting circuit 300 can perform the code setting operation without using the signal indicating the initialization process.

The command decoder 700 may recognize a command for the code setting operation provided from the memory controller and may control the code setting circuit 300 to start the code setting operation in response to the command.

Figure 5:
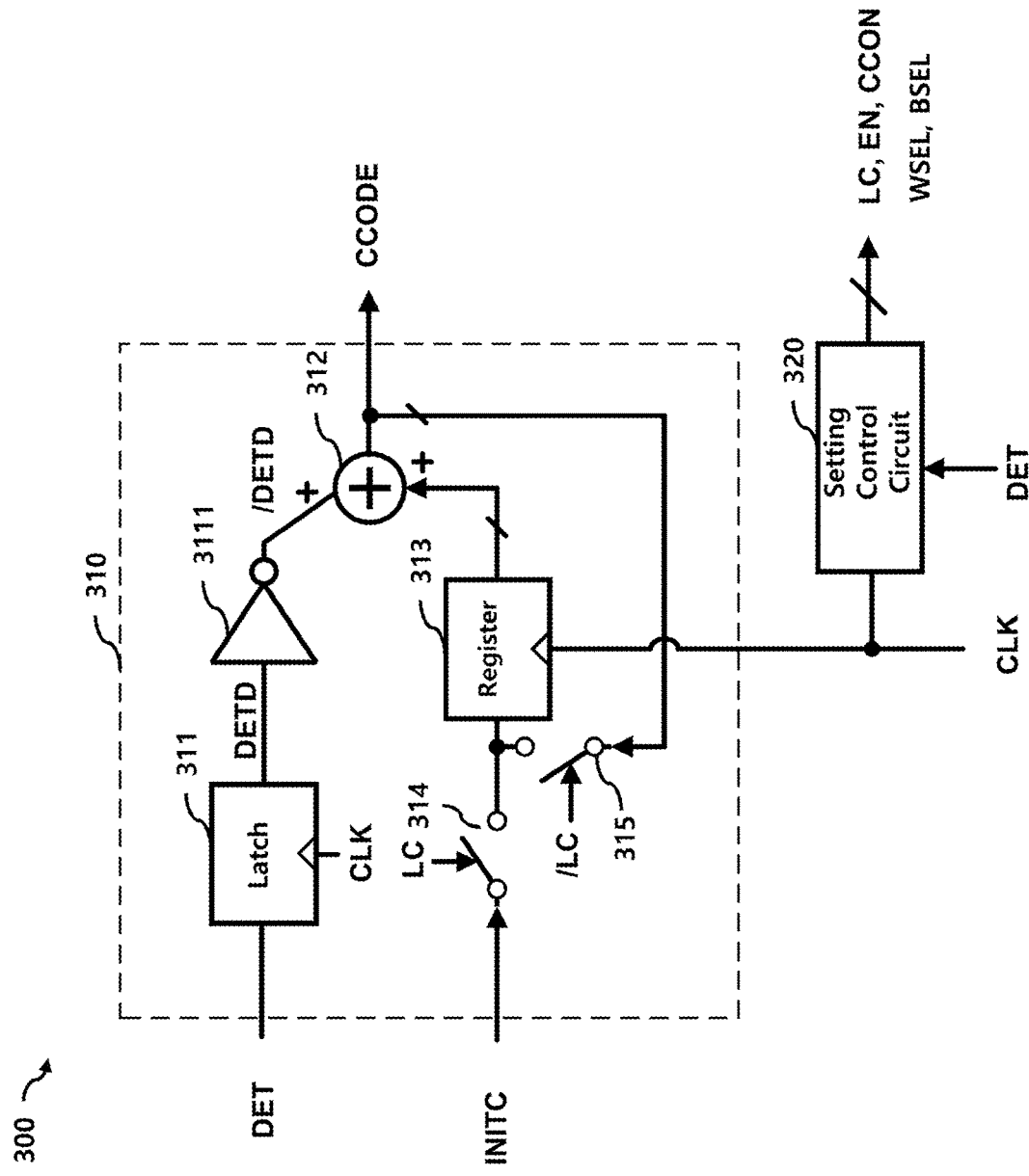
FIG. 5 illustrates a code setting circuit according to an embodiment of the present disclosure.

FIG. 5 illustrates a code setting circuit 300 according to an embodiment of the present disclosure.

The code setting circuit 300 includes a code changing circuit 310 and a setting control circuit 320.

The code changing circuit 310 changes a value of a control code CCODE according to a clock signal CLK and a snapback detection signal DET.

The code changing circuit 310 includes a latch 311, an inverter 3111, an arithmetic circuit 312, a register 313, a first switch 314, and a second switch 315.

The code changing circuit 310 uses an initial code INITC at the beginning of an operation of generating the control code CCODE and thereafter feeds back the control code CCODE.

The first switch 314 is turned on to provide the initial code INITC as an input of the register 313 according to a first switch control signal LC. Subsequently, the second switch 315 is turned on in response to a second switch control signal (e.g., an inverted version of the first switch control signal/LC) to provide an output of the arithmetic circuit 312 as the input of the register 313.

The latch 311 outputs a latch snapback detection signal DETD by latching the snapback detection signal DET according to the clock signal CLK. The inverter 3111 inverts the latch snapback detection signal DETD and outputs an inverted latch snapback detection signal /DETD. The latch 311 and the inverter 3111 may be referred as a step adjusting circuit and the inverted latch snapback detection signal/DETD may be referred as a step signal. In the step adjusting circuit, the latch 311 may be connected after the inverter 3111. In an embodiment, the step signal/DETD has a value 0 or 1. In another embodiment, the step signal/DETD may have a value 0 or k, where k is a positive number except 1.

The arithmetic circuit 312 adds the step signal/DETD and an output of the latch 313 and outputs the addition result as the control code CCODE, and feeds the control code CCODE back to the register 313.

The register 313 latches the control code CCODE according to the clock signal CLK and provides an output thereof to the arithmetic circuit 312.

At the beginning of the operation, the initial code INITC is input to the adder 313.

When the snapback detection signal DET is at a first level (e.g., a logic low level) indicating that a snapback phenomenon is not detected, the latch 311 outputs a first value (e.g., 0), and the output value of the arithmetic circuit 312 becomes a value greater than the output value of the register 313 by 1.

When the snapback detection signal DET is at a second level (e.g., a logic high level) indicating that a snapback phenomenon is detected, the latch 311 outputs a second value (e.g., 1) at the next rising edge of the clock signal CLK and the output value of the arithmetic circuit 312 after the next clock cycle keeps the output value of the register 313 at the current clock cycle.

As a result, when the snapback phenomenon is detected and the latch 311 outputs the value of 1 at the next clock cycle, the value of the control code CCODE is kept to the output value of the register 313 generated at the current cycle of the clock signal CLK.

The setting control circuit 320 outputs the first switch control signal LC, an activation signal EN (e.g., the activation signal EN in FIG. 2), and a current control signal CCON (e.g., the current control signal CCON in FIG. 2) in response to the clock signal CLK and the snapback detection signal DET, and thereby controlling the code changing circuit 310 and a bitline driver (e.g., the bitline driver 4 in FIG. 2).

The setting control circuit 320 further generates a wordline selection signal WSEL and a bitline selection signal BSEL corresponding to a target cell on which a code setting operation is performed, and outputs the wordline selection signal WSEL and the bitline selection signal BSEL to a wordline decoder (e.g., the wordline decoder 2 in FIG. 2) and a bitline decoder (e.g., the bitline decoder 3 in FIG. 2), respectively.

The setting control circuit 320 provides the control code CCODE to a code storage circuit (e.g., the code storage circuit 500 in FIG. 2) when the snapback detection signal DET is asserted and finishes the code setting operation for the target cell according to the clock signal CLK.

Operations of the code setting circuit 300 according to an embodiment of the present disclosure will be described below with reference to FIGS. 6 and 7.

Figure 6:
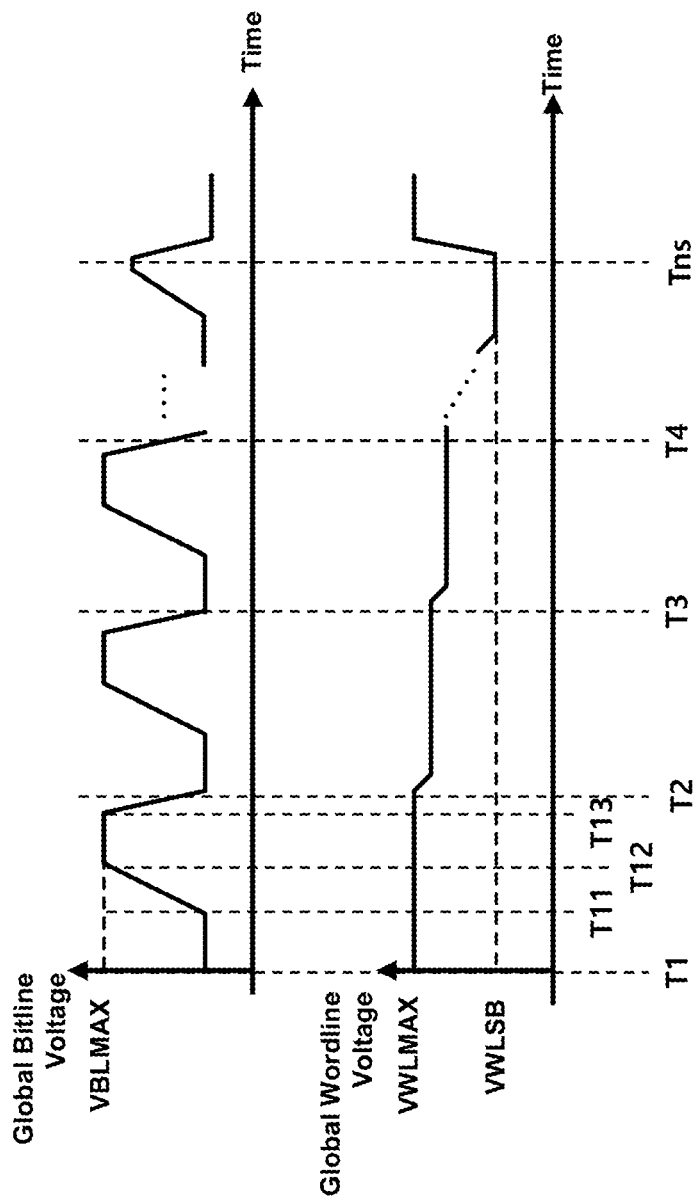
FIG. 6 illustrates an operation of a code setting circuit to set a control code for a first cell according to an embodiment of the present disclosure.
Figure 7:
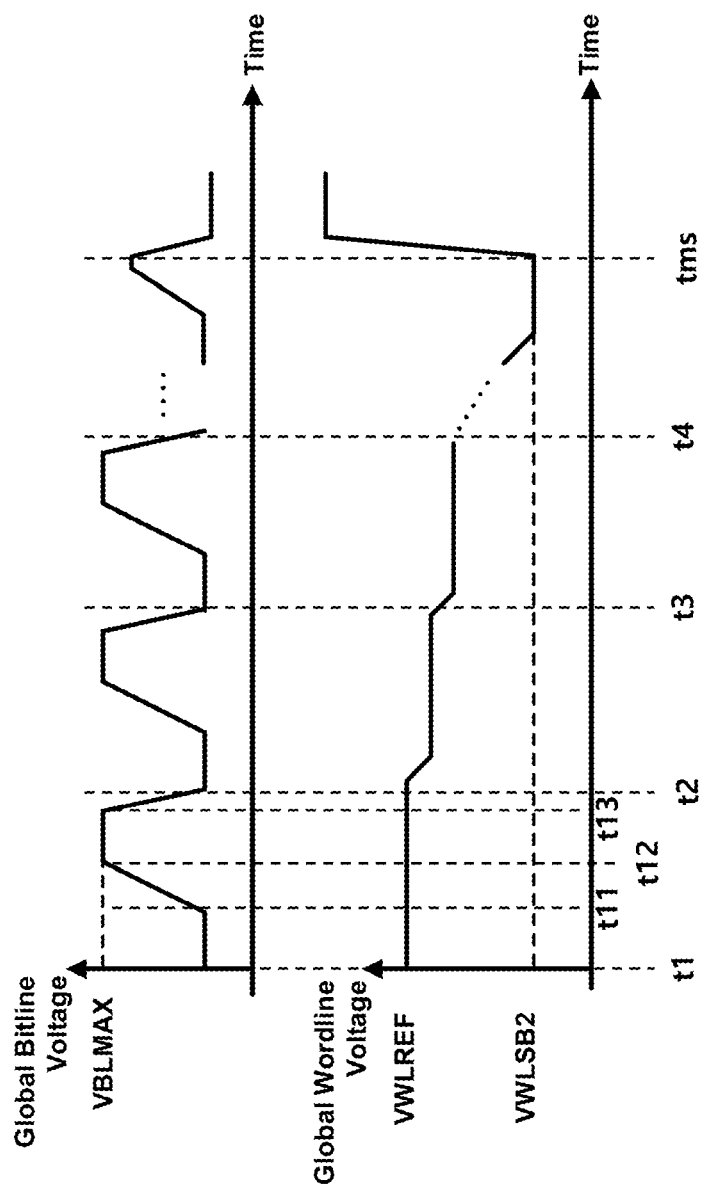
FIG. 7 illustrates an operation of a code setting circuit to set a control code for a second cell according to an embodiment of the present disclosure.

FIGS. 6 and 7 each illustrate a process of programming a cell to a reset state and determining a wordline drive voltage VWL to be applied to a cell, thereby making a reset threshold voltage of the cell substantially constant regardless of the position of the cell.

In FIGS. 6 and 7, the wordline drive voltage VWL represents a voltage of a global wordline (e.g, the global wordline GWL in FIGS. 2 and 3).

FIG. 6 illustrates a process for setting a control code (e.g., the control code CCODE in FIG. 5) corresponding to the first cell C1 of FIG. 2 according to an embodiment.

FIG. 7 illustrates a process for setting a control code corresponding to the second cell C2 of FIG. 2 according to an embodiment.

First, referring to FIG. 6, a process of determining a first reference wordline drive voltage of the first cell C1 in a writing operation will be described.

A bitline driver (e.g., the bitline driver 4 in FIG. 2) is deactivated at a first time T1 and the voltage of the global wordline GWL (i.e., the word line drive voltage VWL) is set to the maximum value VWLMAX.

Subsequently, the bitline driver 4 is activated at a second time T11 and a bitline current (e.g., the bitline current IBL in FIG. 2) is provided to a global bitline (e.g., the global bitline GBL in FIG. 2). Accordingly, when a snapback phenomenon does not occur, the global bitline voltage of the global bitline GBL rises to the maximum value VBLMAX at a third time T12.

At this time, the maximum value VBLMAX of the global bitline voltage may correspond to the maximum value when a cell is programmed to the reset state.

In an embodiment, a snapback detector (e.g., the snapback detector 400 in FIG. 2) may detect whether the snapback phenomenon is occurred or not.

At a fourth time T13, the bitline driver 4 is deactivated, and a wordline (e.g., the wordline WL in FIG. 3) and a bitline (e.g., the bitline BL in FIG. 3) coupled to the first cell C1 are discharged to an initial state.

The discharging process of the wordline and the bitline coupled to the first cell C1 can be performed by controlling a wordline discharge switch (e.g., the wordline discharge switch DP in FIG. 3) and a bitline discharge switch (e.g., the bitline discharge switch DN in FIG. 3).

Then, at each of a fifth time T2, a sixth time T3, and a seventh time T4, and so on, the wordline drive voltage VWL is decreased by a given amount. Other processes in each of a control period from the fifth time T2 to the sixth time T3 and a control period from the sixth time T3 to the seventh time T4 are similar to those in a control period from the first time T1 to the fifth time T2, and thus detailed descriptions thereof are omitted herein for the interest of brevity.

In an embodiment, the period of the clock signal CLK in FIG. 5 may be set to be longer than the control period (e.g., the control period from the first time T1 to the fifth time T2) described above.

In order to lower the wordline drive voltage VWL by the given amount, the value of the control code CCODE may be adjusted by a given value and the reference voltage VREF may be lowered by a given amount. In an embodiment, when the value of the code CCODE is increased by 1, the reference voltage VREF may be decreased by a predetermined value, thereby lowering the level of the reference voltage VREF by a predetermined amount.

FIG. 6 shows that a snapback phenomenon is detected at an eighth time Tns during the the n-th control cycle (or n-th control period).

In this case, the global bitline voltage does not rise to the maximum value VBLMAX, and then falls while the global wordline voltage (or the wordline drive voltage VWL) gradually rises from a snapback wordline voltage VWLSB.

When a snapback phenomenon occurs in the n-th control cycle, value of the control code CCODE at the (n+1)-th control cycle becomes as same as that at the n-th control cycle and the wordline drive voltage VWL used in the n-th control cycle is set as a first reference wordline drive voltage (e.g., a reference wordline drive voltage VWLREF in FIG. 7) for the first cell C1.

Accordingly, when the write operation is performed on the first cell C1, the first reference wordline drive voltage VWLREF is set to the wordline drive voltage VWL used in the n-th control cycle and the control code CCODE used in the n-th control cycle is stored in a code storage unit (e.g., the code storage circuit 500 in FIG. 2) to correspond to the address of the first cell C1.

Next, referring to FIG. 7, a process of determining a second reference wordline drive voltage of a second cell C2 in a writing operation will be described.

In the embodiment shown in FIG. 7, the wordline drive voltage VWL to be initially applied at a first time t1 may be set to the first reference wordline drive voltage VWLREF of the first cell C1, thereby reducing the number of control cycles to determine the second reference wordline drive voltage of the second cell C2.

Other processes in each of a plurality of control periods in FIG. 7 are similar to those in each of the plurality of control periods in FIG. 6, and thus detailed descriptions thereof are omitted herein for the interest of brevity.

In general, since the second cell C2 is positioned farther away from a wordline driver (e.g., the wordline driver 100 in FIG. 2) than the first cell C1, parasitic resistance between a global wordline (e.g., the global wordline GWL in FIG. 2) and the second cell C2 is greater than that between the global wordline and the first cell C1.

Thus, for the second cell C2, a snapback phenomenon occurs when the wordline drive voltage VWL is lower than the first reference wordline drive voltage VWLREF set for the first cell C1.

At the first time t1, the bitline driver 4 is deactivated and the global wordline voltage is set to the first reference wordline drive voltage VWLREF of the first cell C1.

Subsequently, the bitline driver 4 is activated at a second time t11 and the bitline current IBL is provided to the global bitline GBL. Accordingly, when a snapback phenomenon does not occur, the global bitline voltage of the global bitline GBL rises to the maximum value VBLMAX at a third time t12.

The snapback detector 400 may detect whether the snapback phenomenon is occurred or not.

At a fourth time t13, the bitline driver 4 is deactivated, and the wordline and a bitline connected to the second cell C2 are discharged to an initial state.

Then, at each of a fifth time t2, a sixth time t3, and a seventh time t4, and so on, the wordline drive voltage VWL is decreased by a given amount. Other processes in each of a control period from the fifth time t2 to the sixth time t3 and a control period from the sixth time t3 to the seventh time t4 are similar to those in a control period from the first time t1 to the fifth time t2, and thus detailed descriptions thereof are omitted herein for the interest of brevity.

In an embodiment, the period of the clock signal CLK in FIG. 5 may be set to be longer than the control period (e.g., the control period from the first time t1 to the fifth time t2) described above.

In order to lower the wordline drive voltage VWL by the given amount, the reference voltage VREF can be lowered by a given level by adjusting the value of the control code CCODE by a given value.

FIG. 7 shows that a snapback phenomenon is detected at an eight time tms during the m-th control cycle.

In this case, the global bitline voltage does not rise to the maximum value VBLMAX, and then gradually falls while the wordline drive voltage VWL gradually rises from the snapback wordline voltage VWLSB2.

When the snapback phenomenon occurs in the m-th control cycle, the wordline drive voltage VWL used in the m-th cycle is set as the second reference wordline drive voltage of the second cell C2.

Accordingly, in the write operation on the second cell C2, the second reference wordline drive voltage of the second cell C2 is set to the wordline drive voltage VWL used in the m-th control cycle, and the control code CCODE used in the m-th control cycle is stored in the code storage circuit 500 to correspond to the address of the second cell C2.

Control codes CCODE for third and fourth cells C3 and C4 can be set using similar processes to the above-described processes with reference to FIGS. 6 and 7.

In the embodiment shown in FIG. 2, the first and third cells C1 and C3 are coupled to the first bitline. Other values of the control codes CCODE can be determined for any other cells coupled to the first bitline and disposed between the first and third cells C1 and C3 in light of the teachings and disclosures herein.

These values of the control codes CCODE may be stored in the code storage circuit 500 to have a data structure as shown in FIG. 8 according to an embodiment.

A write control circuit (e.g., the write control circuit 600 in FIG. 2) may access the code storage circuit 500 when a write address is input to determine a control code corresponding to a write address.

Referring to FIG. 8, for example, a first code CODE1 may be selected if a first write address corresponds to the first wordline and the first bitline coupled to the first cell C1, and a second code CODE2 may be selected if a second write address corresponds to the first wordline and the last bitline coupled to the second cell C2.

If data corresponding to a third write address is not stored in the table of FIG. 8, the write control circuit 600 may generate a third control code corresponding to the third write address by applying an interpolation technique.

For example, if the third write address corresponds to the first wordline and an intermediate bitline between the first bitline and the last bitline, the write control circuit 600 may obtain each of one or more intermediate values by interpolating a value of the first control code CODE1 and a value of the second control code CODE2, thereby generating the third control code corresponding to the third write address.

In an embodiment, the control code is determined using a linear interpolation method. However, embodiments of the present application are not limited thereto, and a different interpolation method may be used in another embodiment.

FIG. 8 shows a case where the code storage circuit 500 stores the control codes CODE1 to CODE 4 for four cells C1 to C4. The first and second cells C1 and C2 are connected to the first wordline, and the third and fourth cells C3 and C4 are connected to the last wordline.

As the code storage circuit 500 stores a greater number of control codes respectively corresponding to a plurality of cells that are connected to a larger number of wordlines, a value of a control code that is not included in the table of FIG. 8 can be more accurately calculated using a specific interpolation method.

Figure 1:
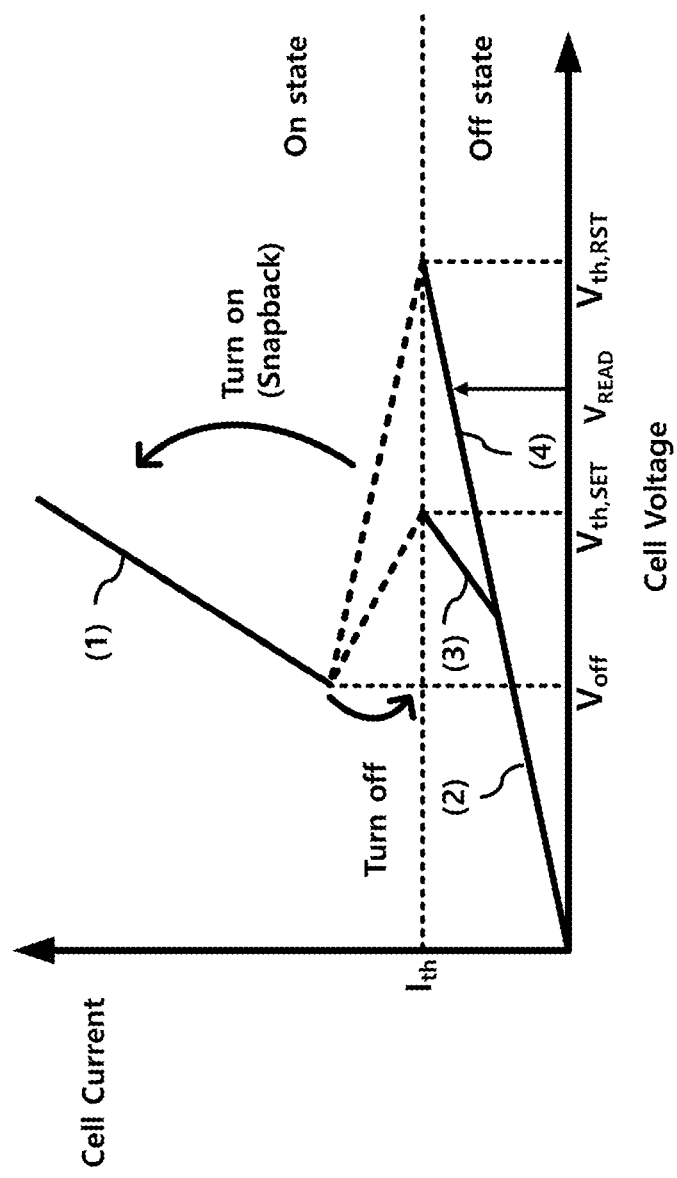
FIG. 1 illustrates a read operation of a semiconductor memory device.
Figure 9:
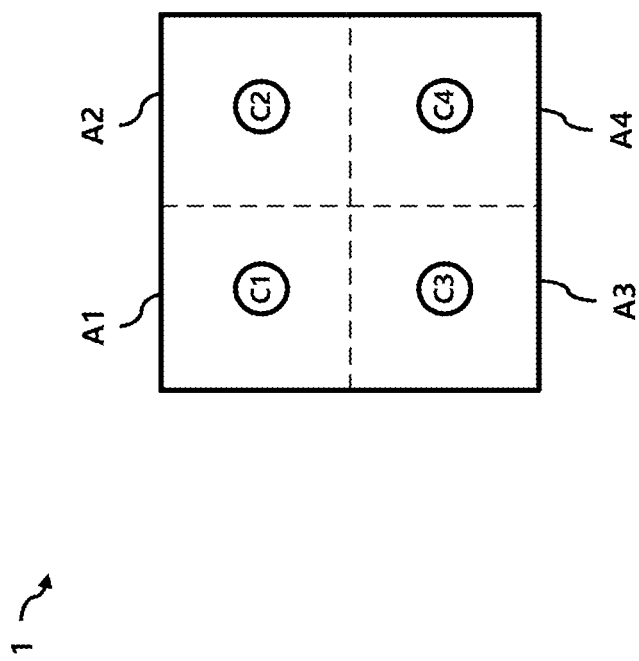
FIG. 9 illustrates a memory cell array including a plurality of regions according to an embodiment of the present disclosure.

FIG. 9 illustrates a memory cell array (e.g., the memory cell array 1 in FIG. 1) divided into a plurality of regions A1, A2, A3, and A4 and determining a control code for a representative cell in each of the plurality of regions A1, A2, A3, and A4, according to an embodiment. Such a control code may be commonly used for cells in a corresponding region A1, A2, A3, or A4.

In FIG. 9, the memory cell array 1 is divided into four regions A1, A2, A3, and A4, and cells located in the middle of the regions A1, A2, A3, and A4 are denoted by C1, C2, C3, and C4, respectively.

A process of determining a reference wordline drive voltage and a control code corresponding to each of the cells C1, C2, C3, and C4 is substantially the same as that described with reference to FIGS. 6 and 7, and thus detailed descriptions thereof are omitted in the interest of brevity.

Control codes CODE1, CODE2, CODE3, and CODE4 obtained for the cells C1, C2, C3, and C4 in FIG. 9 may be stored in association with the regions A1, A2, A3, and A4, respectively, as shown in the table of FIG. 10, according to an embodiment.

For example, the first control code CODE1 corresponds to the first region A1, the second control code CODE2 corresponds to the second area A2, the third control code CODE3 corresponds to the third area A3, and the fourth control code CODE4 corresponds to the fourth area A4.

Each of these control codes CODE1, CODE2, CODE3, and CODE4 may be a control code for the entire cells in a corresponding region A1, A2, A3, or A4.

Accordingly, the write control circuit 600 determines a region A1, A2, A3, or A4 including a cell that corresponds to a write address, and can determine a control code CODE1, CODE2, CODE3, or CODE4 corresponding to the determined region A1, A2, A3, or A4 using the table of FIG. 10. As a result, the write control circuit 660 may determine the control code CODE1, CODE2, CODE3, or CODE4 corresponding to the write address.

The number of regions may vary according to embodiments. As the number of regions increases, a fewer number of cells are set to have a common control code, and thus the variance of threshold voltages of a plurality of cells according to respective cell positions can be further reduced.

In an embodiment of the present disclosure, a cell is programmed to a reset state such that the reset threshold voltage thereof is kept substantially constant regardless of parasitic resistance and parasitic capacitance associated with a position of the cell in a memory array. As a result, the variance of reset threshold voltages of a plurality of cells in the memory array according to an embodiment of the present disclosure may be reduced compared to that of a conventional memory array.

The parasitic resistance and parasitic capacitance associated with the position of the cell also affects programming the cell to a set state. In an embodiment of the present disclosure, the cell is programmed to the set state such that the set threshold voltage may be kept substantially constant regardless of the parasitic resistance and parasitic capacitance associated with the position of the cell. As a result, the variance of set threshold voltages of a plurality of cells in a memory array according to an embodiment of the present disclosure may be reduced compared to that of the conventional memory array.

As described above, a difference between the set threshold voltage and the reset threshold voltage of each of the plurality of cells is kept substantially constant, thereby improving the margin of a read voltage during a read operation, thereby reducing an occurrence of data error.

A process of determining a control code so as to keep a reset threshold voltage of a cell substantially constant when the cell is programmed into a reset state has been disclosed.

An embodiment in which a control code is determined so as to keep a set threshold voltage of a cell substantially constant when the cell is programmed into a set state may be possible in light of the teachings and disclosures herein.

Figure 11B:
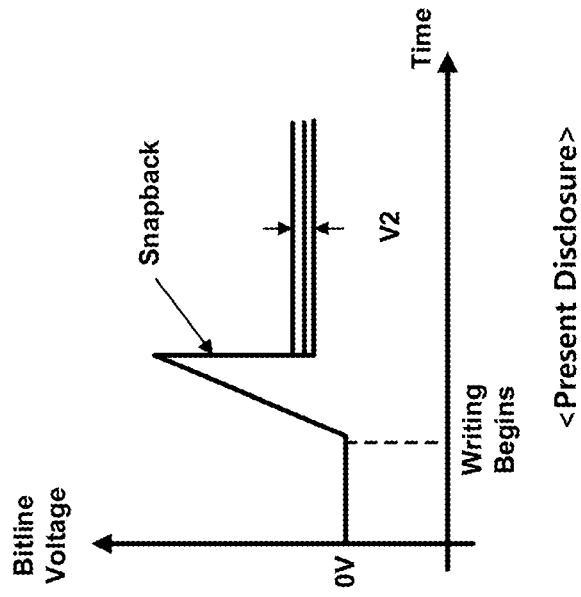
FIG. 11B illustrates bitline voltages of a plurality of cells in a memory device according to an embodiment of the present disclosure.
Figure 11A:
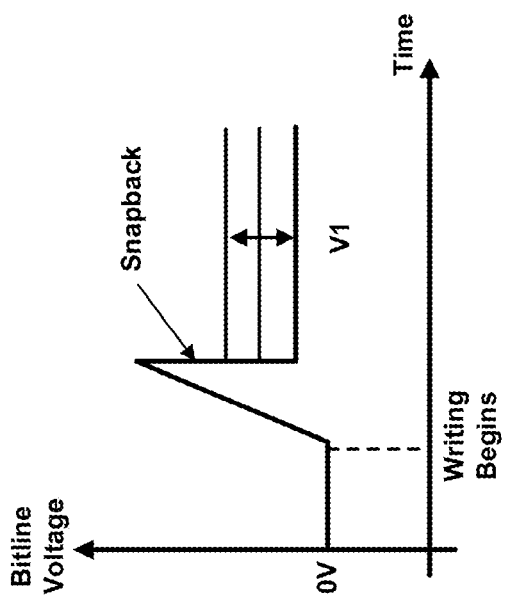
FIG. 11A illustrates bitline voltages of a plurality of cells in a conventional memory device.

FIG. 11A illustrates bitline voltages of a plurality of cells in a conventional memory device. FIG. 11B illustrates bitline voltages of a plurality of cells in a memory device according to an embodiment of the present disclosure.

FIG. 11A shows that a first voltage difference V1 of the bitline voltages after the occurrence of the snapback phenomenon during a write operation, which depend on positions of a plurality of cells, is relatively large in the conventional memory device.

FIG. 11B shows that a second voltage difference V2 of the bitline voltages after the occurrence of the snapback phenomenon in a write operation according an embodiment of the present disclosure is reduced compared to that of the conventional memory device.

Embodiments of the present disclosure adjusts a wordline drive voltage according to a position of each of a plurality cells in a memory array to reduce variance of threshold voltages of the plurality of cells. As a result, the variance of the bitline voltages of the plurality of cells after the occurrence of the snapback phenomenon decreases as shown in FIG. 11B.

Although various embodiments have been described for illustrative purposes, various changes and modifications may be possible.

What is claimed is:

1. A semiconductor memory device comprising:
a memory cell array including a plurality of wordlines, a plurality of bitlines, and a plurality of cells;
a bitline decoder configured to couple a global bitline to one of the plurality of bitlines according to a bitline selection signal;
a bitline driver configured to provide a bitline current to the global bitline;
a wordline decoder configured to couple a global wordline to one of the plurality of wordlines according to a wordline selection signal;
a wordline driver configured to provide a wordline drive voltage to the global wordline during a write operation and to adjust the wordline drive voltage according to a write address; and
a write control circuit configured to generate the wordline selection signal and the bitline selection signal, and to control the bitline decoder, the wordline decoder, and the bitline driver.

2. The semiconductor memory device of claim 1, further comprising a reference voltage generator configured to generate a reference voltage according to a control code corresponding to the write address,
wherein the wordline driver generates the wordline drive voltage according to the reference voltage.

3. The semiconductor memory device of claim 2, further comprising a code storage circuit storing the control code set at least for one or more of the plurality of cells,
wherein the write control circuit accesses the code storage circuit and provides the control code corresponding to the write address to the reference voltage generator.

4. The semiconductor memory device of claim 1, further comprising a command decoder providing a write command to the write control circuit.

5. The semiconductor memory device of claim 2, wherein the wordline driver comprises:
a first resistor coupled between a power supply and a first node;
a second resistor coupled between the first node and a second node at which the wordline drive voltage is output;
a transistor coupled between the second node and a ground; and
an amplifier configured to amplify a difference between the reference voltage and a voltage at the first node and to control the MOS transistor.

6. The semiconductor memory device of claim 3, wherein the control code is a first control code, the device further comprising a code setting circuit configured to set the first control code and a second control code and to store the first and second control codes in the code storage circuit.

7. The semiconductor memory device of claim 6, further comprising a snapback detector configured to monitor the wordline drive voltage during a code setting operation for the first control code of a single cell among the plurality of cells, to generate a snapback detection signal indicating whether snapback phenomenon has occurred at the single cell, and to provide the snapback detection signal to the code setting circuit.

8. The semiconductor memory device of claim 7, wherein the code setting circuit increases a value of the first control code by a given value in each of a plurality of control periods during a code setting operation for the single cell, and
wherein the code setting circuit sets the value of the first control code for the single cell to a value of the first control code in a second control period and completes the code setting operation for the single cell, when the snapback detection signal is asserted in the first control period, the first control period immediately preceding the second control period.

9. The semiconductor memory device of claim 8, wherein the code setting circuit comprises:
a code changing circuit configured to output a value of the first control code according to an initial code indicating an initial value of the first control code, the snapback detection signal, and a clock signal; and
a setting control circuit configured to control the code changing circuit according to the clock signal and the snapback detection signal and to control the bitline driver.

10. The semiconductor memory device of claim 9, wherein the code changing circuit comprises:
a register configured to latch the first control code or the initial value of the control code according to the clock signal;
a step adjusting circuit configured to output a step signal according to the clock signal and the snapback detection signal;
an arithmetic circuit configured to add an output value of the register and an output value of the step adjusting circuit;
a first switch configured to provide the initial code to the adder in response to a first switch control signal; and
a second switch configured to provide an output value of the arithmetic circuit to the adder in response to a second switch control signal.

11. The semiconductor memory device of claim 10, wherein the step adjusting circuit outputs the step signal having a value which is not 0 according to the clock signal when the snapback detection signal has a first value, the first value of the snapback detection signal indicating that the snapback phenomenon has not occurred, and
wherein the step adjusting circuit outputs the step signal having a predetermined value according to the clock signal when the snapback detection signal has a second value, the second value of the snapback detection signal indicating that the snapback phenomenon has occurred.

12. The semiconductor memory device of claim 9, wherein the code setting circuit controls the bitline driver to generate the bitline current until a voltage of the global bitline reaches a maximum value when the snapback detection signal has a first value, the first value of the snapback detection signal indicating that the snapback phenomenon has not occurred.

13. The semiconductor memory device of claim 6, wherein the write address is a first write address corresponding to the first control code, and a second write address corresponds to the second control code, wherein the code storage circuit stores the first and second control codes during a code setting operation, and wherein the write control circuit determines a third control code corresponding to a third write address using an interpolation between the first and second control codes stored in the code storage circuit when the third control code corresponding to the third write address is not stored in the code storage circuit.

14. The semiconductor memory device of claim 6, wherein the code storage circuit stores the first and second control codes respectively representing first and second regions of the memory cell array during a code setting operation.

15. The semiconductor memory device of claim 6, wherein the code setting circuit performs a code setting operation during an initialization of the semiconductor memory device.

16. The semiconductor memory device of claim 6, further comprising a command decoder generating a code setting instruction, wherein the code setting circuit performs a code setting operation according to the code setting instruction.

17. A memory device comprising:

a first memory cell coupled to a first bitline and a first wordline;

a second memory cell coupled to a second bitline and a second wordline;

a wordline decoder configured to couple a global wordline to one of the first and second wordlines according to a wordline selection signal;

a wordline driver configured to provide a wordline drive voltage to the global wordline during a write operation; and a code setting circuit configured to set a first control code corresponding to a first reference wordline drive voltage for the first memory cell, and to set a second control code corresponding to a second reference wordline drive voltage for the second memory cell.

18. The memory device of claim 17, further comprising a reference voltage generator configured to adjust a level of a reference voltage according to the value of the first control code and provide the reference voltage to the wordline driver.

19. The memory device of claim 17, wherein the code setting circuit increases a value of the first control code by a given value in each of a plurality of control periods to decrease a level of the wordline drive voltage by a given amount in a code setting operation for the first memory cell.

20. The memory device of claim 17, wherein the second memory cell is positioned farther away from an output node of the wordline driver than the first memory cell, and wherein the wordline voltage driver initially provides the wordline drive voltage having a level equal to that of the first reference wordline drive voltage in a code setting operation for the second memory cell.

* * * * *